US011539362B1

(12) United States Patent
Chen et al.

(10) Patent No.: US 11,539,362 B1
(45) Date of Patent: Dec. 27, 2022

(54) RADIO FREQUENCY SWITCH FOR PROVIDING CONSTANT ISOLATION OVER MULTIPLE FREQUENCY BANDS

(71) Applicant: RichWave Technology Corp., Taipei (TW)

(72) Inventors: Chih-Sheng Chen, Taipei (TW); Pei-Chuan Hsieh, Taipei (TW); Tsung-Han Lee, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/565,395

(22) Filed: Dec. 29, 2021

(30) Foreign Application Priority Data

Dec. 17, 2021 (TW) ................................ 110147335

(51) Int. Cl.
  *H03K 17/687* (2006.01)
  *H03K 17/16* (2006.01)
(52) U.S. Cl.
  CPC ....... *H03K 17/6871* (2013.01); *H03K 17/161* (2013.01)
(58) Field of Classification Search
  CPC ..................... H03K 17/6871; H03K 17/161
  See application file for complete search history.

(56) References Cited

U.S. PATENT DOCUMENTS

| | | | |
|---|---|---|---|
| 2005/0231439 A1* | 10/2005 | Suwa | ............ H01P 1/15 343/876 |
| 2014/0055210 A1 | 2/2014 | Black | |
| 2018/0145707 A1 | 5/2018 | Cheon | |
| 2020/0182924 A1 | 6/2020 | Shapiro | |

FOREIGN PATENT DOCUMENTS

| CN | 109756216 A | | 5/2019 |
|---|---|---|---|
| JP | 2003101304 A | * | 4/2003 |

OTHER PUBLICATIONS

Office action dated Jul. 21, 2022 for the Taiwan application No. 110147335, filing date Dec. 17, 2021, p. 1-6, dated Jul. 21, 2022.

* cited by examiner

*Primary Examiner* — Metasebia T Retebo
(74) *Attorney, Agent, or Firm* — Winston Hsu

(57) ABSTRACT

A radio frequency (RF) switch includes a first terminal, a second terminal, a series switch circuit, a shunt switch circuit, an inductor and a reference voltage terminal. An RF signal at the first terminal. The series switch circuit is coupled to the first terminal, the second terminal, and the shunt switch circuit. The shunt switch circuit includes a sub-switch circuit, a transistor coupled to the sub-switch circuit, and a compensation capacitor parallel-coupled to the transistor. The inductor is coupled to the shunt switch circuit and the reference voltage terminal. When the RF signal is operated in a first frequency band, the first transistor is turned on for the shunt switch circuit and the inductor to provide a first impedance. When the RF signal is operated in a second frequency band, the first transistor is turned off for the shunt switch circuit and the inductor to provide a second impedance.

20 Claims, 8 Drawing Sheets

RADIO FREQUENCY SWITCH FOR PROVIDING CONSTANT ISOLATION OVER MULTIPLE FREQUENCY BANDS

TECHNICAL FIELD

The present invention relates to a RF circuit, and in particular, to a RF switch of a RF circuit for providing constant isolation over multiple frequency bands.

BACKGROUND

Radio Frequency (RF) switches may direct RF signals via one or more transmission paths, and are widely used in televisions, mobile phones, wireless communication devices, WiFi devices, Bluetooth devices and satellite communication devices.

However, since the RF switch is coupled to an external circuit via a bond wire, and the inductance of the bond wire varies as the RF signal Srf is operated in a plurality of frequency bands, the signal isolation of the RF switch is reduced, resulting in degradation of the signal quality.

SUMMARY

According to an embodiment of the invention, a radio frequency switch includes a first signal terminal, a second signal terminal, a first series switch circuit, a shunt switch circuit, an inductor and a reference voltage terminal. The first signal terminal is used to receive an RF signal. The first series switch circuit is coupled to the first signal terminal and the second signal terminal, and includes a first series transistor. The shunt switch circuit is coupled to the first series switch circuit, and includes a first sub-switch circuit, a first transistor coupled to the first sub-switch circuit, and a first compensation capacitor coupled in parallel to the first transistor. The inductor is coupled to the shunt switch circuit. The reference voltage terminal is coupled to the inductor. When the RF signal is operated in a first frequency band, the first transistor is turned on, and the shunt switch circuit and the inductor provide a first impedance. When the RF signal is operated in a second frequency band, the first transistor is turned off, and the shunt switch circuit and the inductor provide a second impedance.

DETAILED DESCRIPTION

Figure 1:
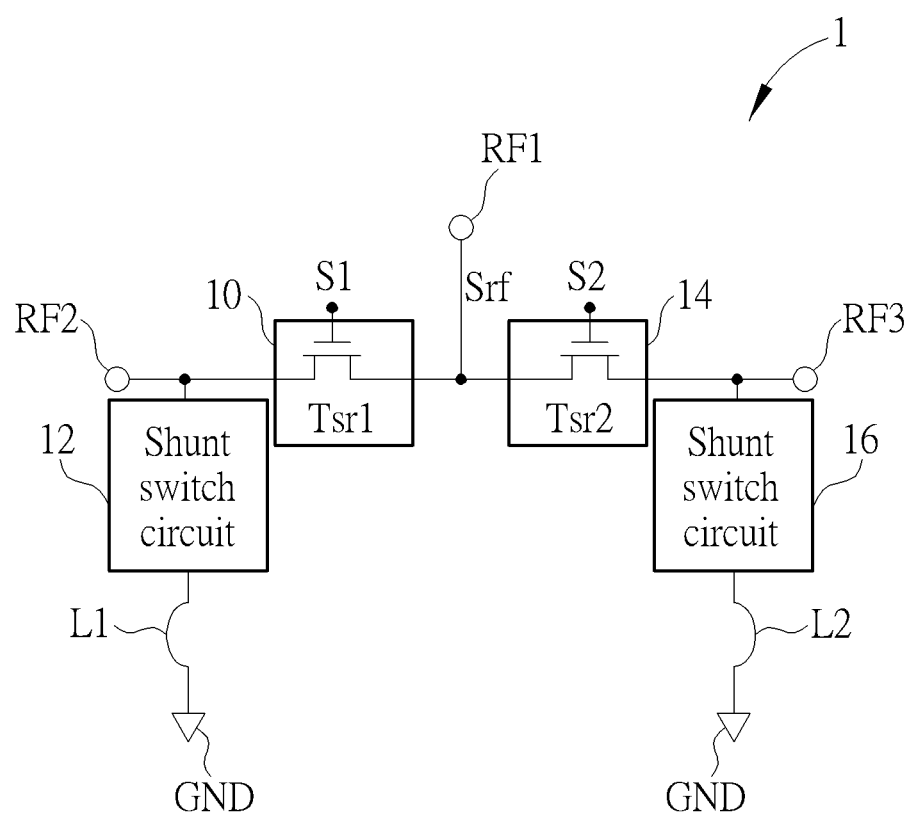
FIG. 1 is a schematic diagram of a radio frequency (RF) switch according to an embodiment of the invention.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like elements throughout.

FIG. 1 is a schematic diagram of a radio frequency (RF) switch 1 according to an embodiment of the invention. The RF switch 1 is a single-pole double-throw (SPDT) switch, which may transmit or receive an RF signal Srf in one of two transmission paths. The RF signal Srf may operate in a plurality of frequency bands, such as the 2 GHz frequency band and the 5 GHz frequency band. When the RF signal Srf is transmitted or received in one of the two transmission paths, the other one of the two transmission paths will be disconnected to provide substantially constant signal isolation for different frequency bands.

The RF switch 1 includes a signal terminal RF1, a signal terminal RF2, a series switch circuit 10, a shunt switch circuit 12, an inductor L1, and a reference voltage terminal GND. The signal terminal RF1 may be coupled to the antenna and may receive the RF signal Srf. The signal terminal RF2 may be coupled to an RF circuit such as a matching circuit, a power amplifier, a filter or other circuits. The series switch circuit 10 is coupled to the signal terminals RF1 and RF2, and may include a transistor Tsr1. The transistor Tsr1 includes a first terminal coupled to the signal terminal RF1, a second terminal coupled to the signal terminal RF2, and a control terminal configured to receive the control signal S1 to control the transistor Tsr1. The transistor Tsr1 may be, but is not limited to, N-type Metal-Oxide-Semiconductor Field-Effect Transistors (MOSFET), and the control signal S1 may be a voltage signal. The shunt switch circuit 12 is coupled to the series switch circuit 10. The inductor L1 is a bond wire coupled between the shunt switch circuit 12 and the reference voltage terminal GND. In some embodiments, the reference voltage terminal GND may provide a reference voltage such as 0V.

The RF switch 1 may further include a signal terminal RF3, a series switch circuit 14, a shunt switch circuit 16, and an inductor L2. The signal terminal RF3 may be coupled to an RF circuit such as a matching circuit, a power amplifier, a filter or other circuits. The switch circuit 14 is coupled to the signal terminals RF1 and RF3, and may include a transistor Tsr2. The transistor Tsr2 includes a first terminal coupled to the signal terminal RF1, a second terminal coupled to the signal terminal RF3, and a control terminal configured to receive the control signal S2 to control the transistor Tsr2. The transistor Tsr2 may be an N-type MOSFET, and the control signal S2 may be a voltage signal. The shunt switch circuit 16 is coupled to the series switch circuit 14. The inductor L2 is also a bond wire, coupled between the shunt switch circuit 14 and the reference voltage terminal GND.

When the transmission path from the signal terminal RF1 to the signal terminal RF3 is connected, and the transmission path from the signal terminal RF1 to the signal terminal RF2 is disconnected, the series switch circuit 14 will be turned on, the shunt switch circuit 16 will be turned off, the series switch circuit 10 will be turned off, and the shunt switch circuit 12 will be turned on, so that most of the power of the RF signal Srf will be transferred between the signal terminal RF1 to the signal terminal RF3, and the leaks of the RF signal Srf between the signal terminal RF1 to the signal terminal RF2 will be directed to the reference voltage terminal GND via the shunt switch circuit 12, so as to achieve signal isolation. The impedance of the inductor L1 will vary with the signal frequency, as expressed by Equation (1):

$$ZL = j\omega L \qquad \text{Equation(1)}$$

where ZL is the impedance of an inductor;
ω is a signal frequency; and
L is the inductance of the inductor L1.

According to Equation (1), as the frequency of the RF signal Srf increases, the impedance of the inductor L1 will increase accordingly. The shunt switch circuit 12 may vary the equivalent impedance thereof with the frequency of the RF signal Srf, so as to keep a sum of the equivalent impedance of the shunt switch circuit 12 and the impedance of the inductor L1 substantially constant, thereby keeping the signal isolation of the RF switch 1 unchanged.

Similarly, when the transmission path between the signal terminal RF1 and the signal terminal RF2 is connected, and the transmission path between the signal terminal RF1 and the signal terminal RF3 is disconnected, the shunt switch circuit 16 may vary the equivalent impedance thereof with the frequency of the RF signal Srf, so as to keep a sum of the equivalent impedance of the shunt switch circuit 16 and the impedance of the inductor L2 substantially constant, thereby keeping the signal isolation of the RF switch 1 unchanged.

While FIG. 1 shows that the series switch path 10 and the series switch path 14 only include one transistor Tsr1 and one transistor Tsr2, respectively, in other embodiments, the series switch path 10 may include N transistors Tsr1 and receive the control signal S1 to control the N transistors Tsr1, and the series switch path 14 may include M transistors Tsr2 and receive the control signal S2 to control the M transistors Tsr2, the N transistors Tsr1 being serially connected in sequence, and the M transistors Tsr2 being serially connected in sequence, N, M being identical or different positive integers. Further, while FIG. 1 only shows a SPST switch, the present invention may also be applied to other types of switches such as a single-pole a plurality of-throw (SPMT) switch or a multiple-pole multiple-throw (MPMT) switch.

Figure 2:
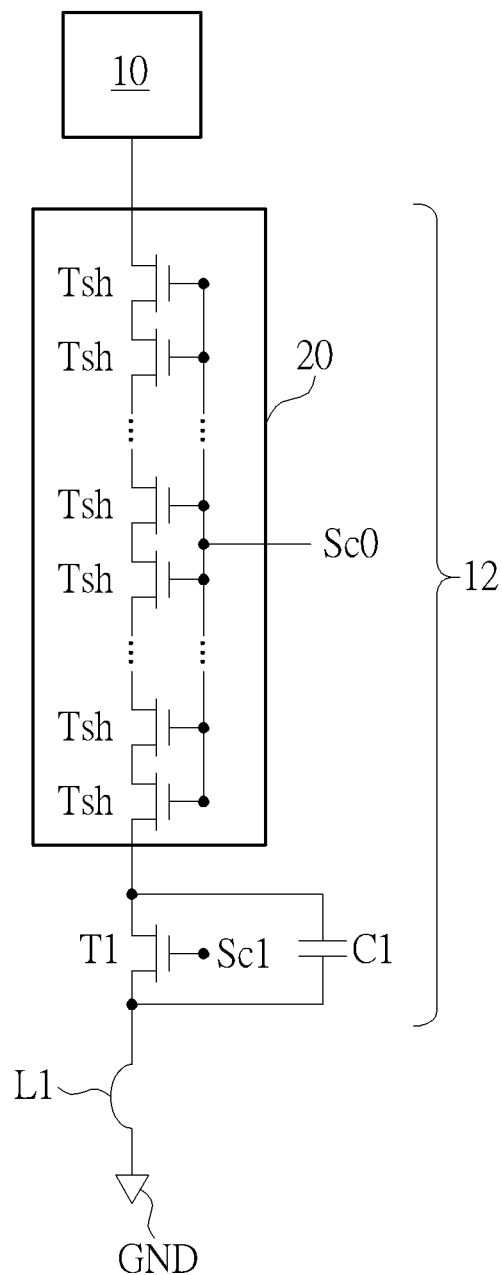
FIG. 2 is a circuit schematic of the shunt switch circuit in FIG. 1 according to an embodiment of the invention.

FIG. 2 is a circuit schematic of the shunt switch circuit 12 according to an embodiment of the invention. The shunt switch circuit 12 includes a sub-switch circuit 20, a transistor T1, and a compensation capacitor C1. The sub-switch circuit 20 includes a first terminal coupled to the series switch circuit 10, and a second terminal. The transistor T1 includes a first terminal coupled to the second terminal of the sub-switch circuit 20, a second terminal coupled to the inductor L1, and a control terminal configured to receive the control voltage Sc1 to control the transistor T1. The compensation capacitor C1 is coupled in parallel to the transistor T1, and includes a first terminal coupled to the first terminal of the transistor T1, and a second terminal coupled to the second terminal of the transistor T1. The sub-switch circuit 20 may include I stacked transistors Tsh, where I is a positive integer, e.g., I is equal to 8. The I transistors Tsh are equal in size and are all controlled by the control signal Sc0. The transistors Tsh and T1 may be N-type MOSFETs, and the control signals Sc0 and Sc1 may be voltage signals. The control signal Sc0 and the control signal Sc1 may separately control the I transistors Tsh and the transistor T1 for the shunt switch circuit 12 to provide different equivalent impedances in the frequency band B1 and the frequency band B2, as shown in Table 1:

TABLE 1

| Frequency band | Tsh | T1 | C1 |
|---|---|---|---|
| B1 | On | On | No |
| B2 | On | Off | Yes |

The frequency band B2 is different from the frequency band B1. The frequency of frequency band B1 may be lower than the frequency of frequency band B2. For example, the frequency band B1 may be a 2 GHz frequency band, and the frequency band B2 may be a 5 GHz frequency band. As shown in Table 1, when the RF signal Srf is operated in the frequency band B1, the I stacked transistors Tsh of the sub-switch circuit 20 will be turned on and the transistor T1 will be turned on to skip the compensation capacitor C1 and couple the second terminal of the first sub-switch circuit 20 to the inductor L1 via the transistor T1, enabling the shunt switch circuit 12 and the inductor L1 to provide a first impedance. In some embodiments, when the transistor Tsr2 of the series switch circuit 14 is turned on and the RF signal Srf is operated in the frequency band B1, the shunt switch circuit 12 provides the first impedance corresponding to the isolation of the frequency band B1, as expressed by Equation (2):

$$ZB1 = Ron + j\omega 1 L \qquad \text{Equation(2)}$$

Where ZB1 is the first impedance;
Ron is the on-resistance of the I stacked transistors Tsh;
ω1 is the frequency of the RF signal Srf in the frequency band B1; and
L is the inductance of the inductor L1.

When the RF signal Srf is operated in the frequency band B2, the I stacked transistors Tsh of the sub-switch circuit 20 will be turned on and the transistor T1 will be turned off to couple the second terminal of the first sub-switch circuit 20 to the inductor L1 via the compensation capacitor C1, enabling the shunt switch circuit 12 and the inductor L1 to provide a second impedance.

Figure 3:
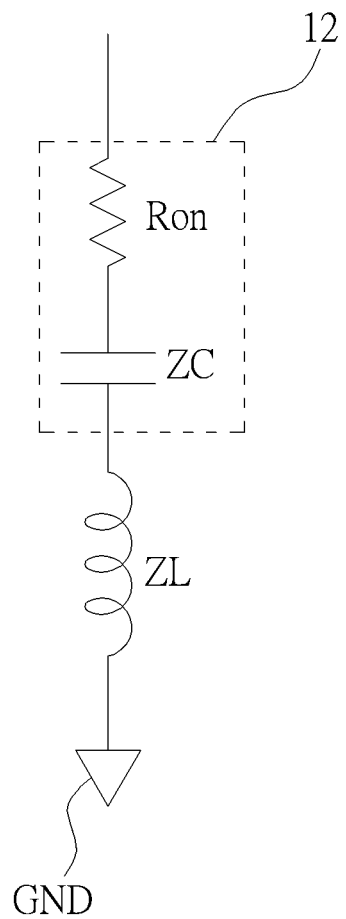
FIG. 3 shows an equivalent circuit diagram of the shunt switch circuit and inductor in FIG. 1 when operated in a frequency band.

FIG. 3 is an equivalent circuit diagram of the shunt switch circuit 12 and the inductor L1 when operated in the band B2. The equivalent circuit diagram includes an on-resistance Ron of the sub-switch circuit 20, the impedance ZC of the compensation capacitor C1, and the impedance ZL of the inductor L1. The on-resistance Ron may be generated by the conduction of the I stacked transistors Tsh in the sub-switch circuit 20, the impedance ZL may be expressed by Equation (1), and the impedance ZC may be expressed by Equation (3):

$$ZC = -j/\omega C \qquad \text{Equation(3)}$$

where ZC is the impedance of a capacitor;
ω is a signal frequency; and
C is the capacitance of the compensation capacitor C1.

As shown in Equation (3), when operated in the frequency band B2, the compensation capacitor C1 may provide a negative imaginary part of the impedance to cancel out a positive imaginary part of the impedance generated by the inductor L1 owing to the increase in the frequency of the RF signal Srf. A sum of the on-resistance Ron of the sub-switch circuit 20, the impedance ZC of the compensation capacitor C1, and the impedance ZL of the inductor L1 is equal to the second impedance. In some embodiments, when the transistor Tsr2 of the series switch circuit 14 is turned on and the RF signal Srf is operated in the frequency band B2, the shunt switch circuit 12 provides the second impedance corresponding to the isolation of the frequency band B2. The second impedance may be expressed as Equation (4):

$$ZB2 = Ron + j\omega 2L - j/\omega 2C \quad \text{Equation(4)}$$

Where ZB2 is the second impedance;
Ron is the on-resistance of the I stacked transistors Tsh;
ω2 is the frequency of the RF signal Srf in the frequency band B2;
L is the inductance of the inductor L1; and
C is the capacitance of the compensation capacitor C1.

The second impedance ZB2 may be equal to the first impedance ZB1. For example, if the inductance L of the inductor L1 is 500 pH and the capacitance C of the compensation capacitor C1 is 3.38 pF, according to Equation (2) and Equation (4), $ZB1 = Ron + j6.28 (= Ron + j*2*\pi*2*10^9*500*10^{-12})$ and $ZB2 = Ron + j6.28 (= Ron + j*2*\pi*5*10^9*500*10^{-12} - j/(2*\pi*5*10^9*3.38*10^{-12}))$, and the second impedance ZB2 is equal to the first impedance ZB1. Therefore, the sum of the equivalent impedance of the shunt switch circuit 12 and the impedance ZL of the inductor L1 remains substantially constant, and consequently, the signal isolation of the RF switch 1 remains unchanged.

The circuit configuration and operation of the shunt switch circuit 16 are similar to those of the shunt switch circuit 12 in FIG. 2 and the explanation therefor will be omitted here for brevity.

Figure 4:
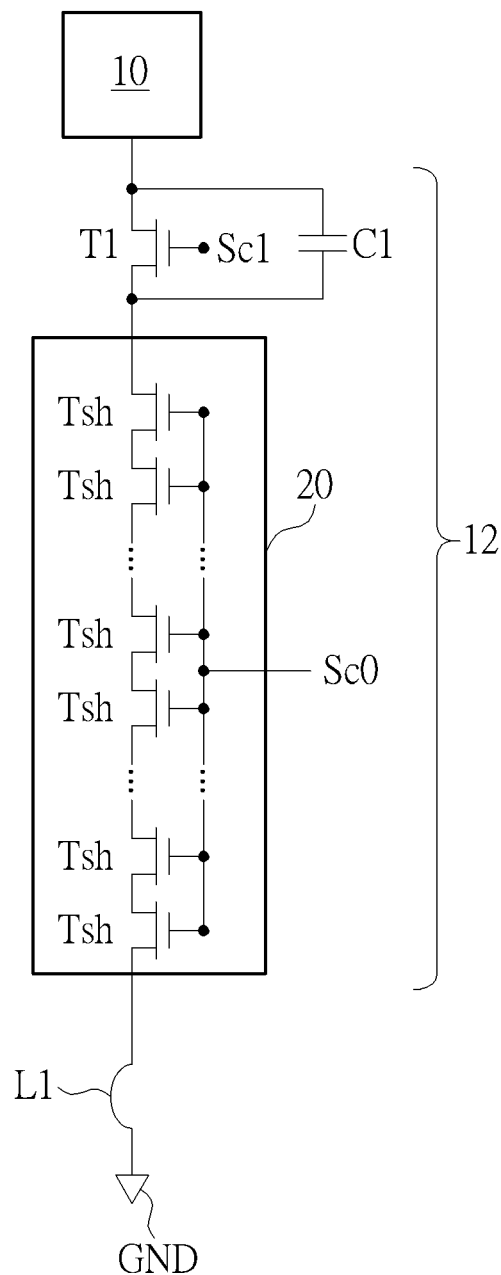
FIG. 4 is a circuit schematic of the shunt switch circuit in FIG. 1 according to another embodiment of the invention.

FIG. 4 is a circuit schematic of the shunt switch circuit 12 according to another embodiment of the invention. The shunt switch circuits 12 in FIG. 4 and FIG. 2 are different in the circuit configurations of the sub-switch circuit 20, the transistor T1, and the compensation capacitor C1. In FIG. 4, the first terminal of the transistor T1 and the first terminal of the compensation capacitor C1 are coupled to the series switch circuit 10, and the first terminal of the sub-switch circuit 20 is coupled to the second terminal of the transistor T1 and the second terminal of the compensation capacitor C1, and the second terminal of the sub-switch circuit 20 are coupled to the inductor L1. The operation of the shunt switch circuit 12 in FIG. 4 is similar to that of the shunt switch circuit 12 in FIG. 2, and the explanation therefor will be omitted here for brevity.

Figure 5:
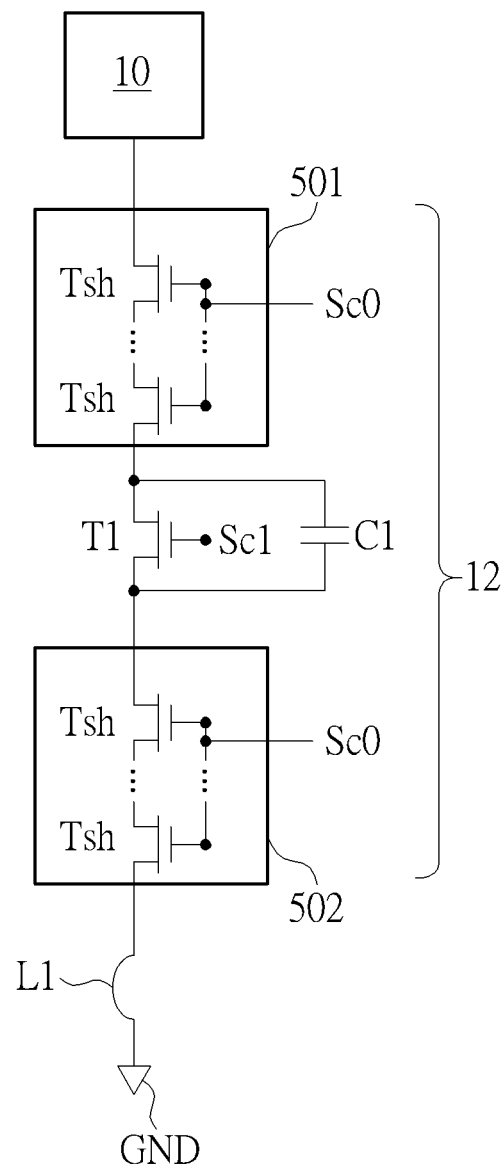
FIG. 5 is a circuit schematic of the shunt switch circuit in FIG. 1 according to another embodiment of the invention.

FIG. 5 is a circuit schematic of the shunt switch circuit 12 according to another embodiment of the invention. The shunt switch circuit 12 in FIG. 5 includes a sub-switch circuit 501, the transistor T1, the compensation capacitor C1, and a sub-switch circuit 502. The sub-switch circuit 501 includes a first terminal coupled to the series switch circuit 10, and a second terminal. The first terminal of the transistor T1 and the first terminal of the compensation capacitor C1 are coupled to the second terminal of the sub-switch circuit 501. The sub-switch circuit 502 includes a first terminal coupled to the second terminal of the transistor T1 and the second terminal of the compensation capacitor C1, and a second terminal coupled to the inductor L1. The sub-switch circuit 501 and the sub-switch circuit 502 may include J transistors Tsh and K transistors Tsh, respectively, J and K being positive integers. For example, the sum of J and K may be equal to I. The J transistors Tsh and K transistors Tsh may be controlled by the control signal Sc0. The operation of the shunt switch circuit 12 in FIG. 5 is similar to that of the shunt switch circuit 12 in FIG. 2, and the explanation therefor will be omitted here for brevity.

Figure 6:
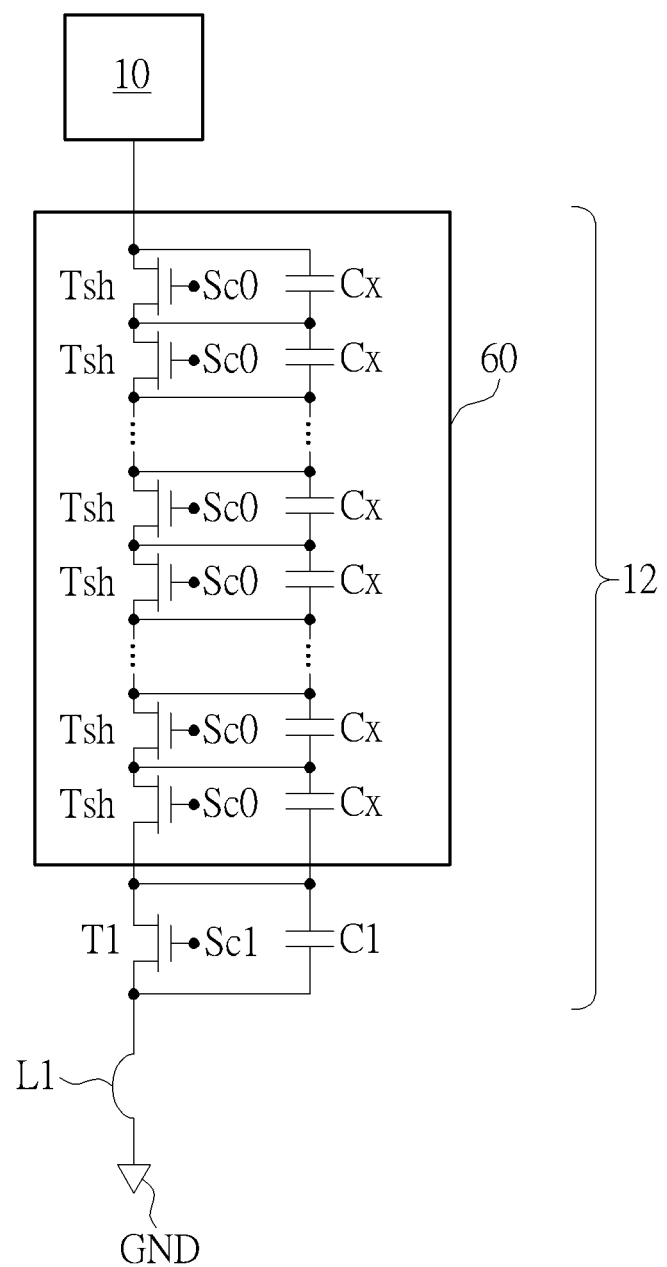
FIG. 6 is a circuit schematic of the shunt switch circuit in FIG. 1 according to another embodiment of the invention.

FIG. 6 is a circuit schematic of the shunt switch circuit 12 according to another embodiment of the invention. FIG. 6 and FIG. 2 are different in that the sub-switch circuit 20 in FIG. 2 is replaced with the sub-switch circuit 60 in FIG. 6. The sub-switch circuit 60 includes I stacked transistors Tsh and I coupling capacitors Cx. Each coupling capacitor Cx is coupled to the first terminal and the second terminal of a corresponding stacked transistor Tsh in the I stacked transistors Tsh. The I stacked transistors Tsh are equal in size, and the I coupling capacitors Cx are equal in size, so that the voltages across respective coupling capacitors Cx are substantially identical, thereby enhancing electrostatic discharge (ESD) characteristics. The I stacked transistors are controlled by the control signal Sc0, and the transistor T1 is controlled by the control signal Sc1. The control signal Sc0 and the control signal Sc1 may separately control the I transistors Tsh and the transistor T1. The operation of the shunt switch circuit 12 in FIG. 6 is similar to that of the shunt switch circuit 12 in FIG. 2, and the explanation therefor will be omitted here for brevity.

Figure 7:
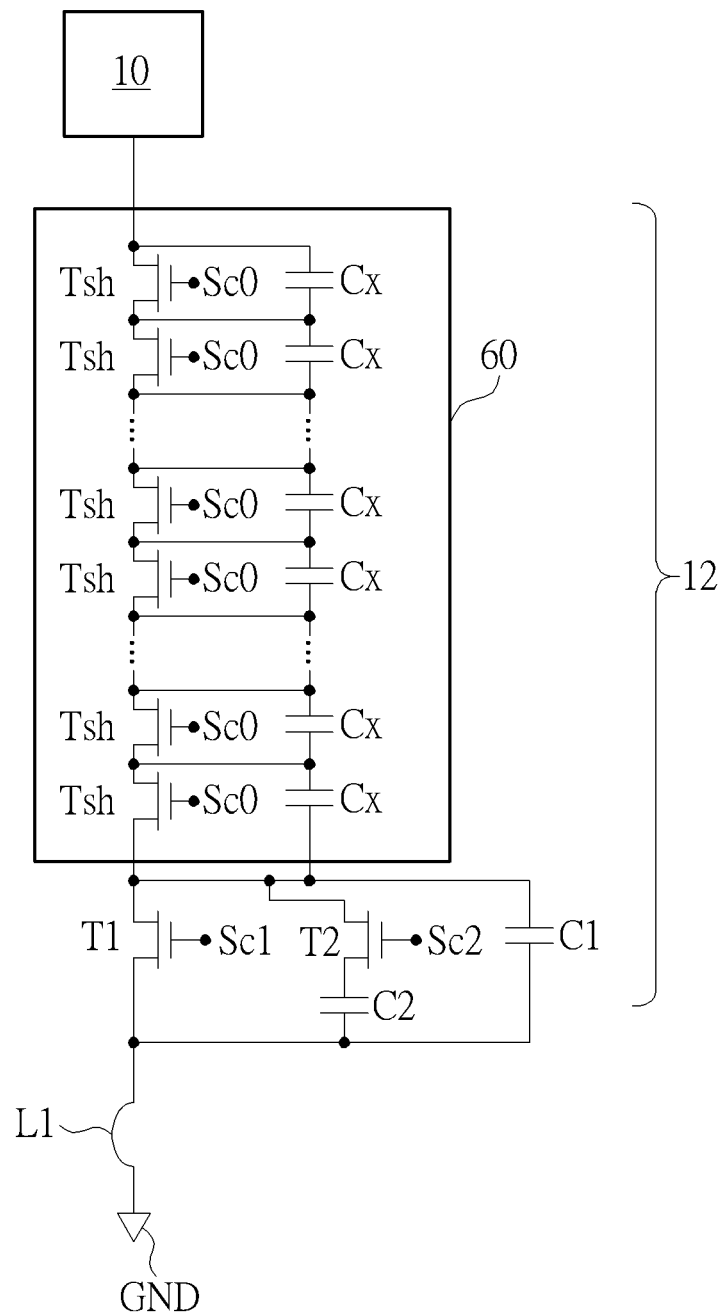
FIG. 7 is a circuit schematic of the shunt switch circuit in FIG. 1 according to another embodiment of the invention.

FIG. 7 is a circuit schematic of the shunt switch circuit 12 according to another embodiment of the invention. FIG. 7 and FIG. 6 are different in that the shunt switch circuit 12 in FIG. 7 further includes a transistor T2 and a compensation capacitor C2. The transistor T2 includes a first terminal coupled to the second terminal of the sub-switch circuit 60, a second terminal coupled to the inductor L1, and a control terminal configured to receive a control signal Sc2 to control the transistor T2. The compensation capacitor C2 is coupled in series to the transistor T2, and includes a first terminal coupled to the second terminal of the transistor T2, and a second terminal coupled to the inductor L1. The transistor T2 may be an N-type MOSFET, and the control signal Sc2 may be a voltage signal. The control signal Sc0, the control signal Sc1, and the control signal Sc2 may separately control the I transistors Tsh, the transistor T1, and the transistor T2 for the shunt switch circuit 12 in FIG. 7 to provide different equivalent impedances in the frequency bands B1, B2, and B3, as shown in Table 2:

TABLE 2

| Frequency band | Tsh | T1 | T2 | C1 | C2 |
|---|---|---|---|---|---|
| B1 | On | On | Off | No | No |
| B2 | On | Off | Off | Yes | No |
| B3 | On | Off | On | Yes | Yes |

The frequency band B1, the frequency band B2, and the frequency band B3 may be different. The frequency band B1 may be lower than the frequency band B2. The capacitance of the compensation capacitor C1 and the capacitance of the compensation capacitor C2 may be identical or different. In some embodiments, the frequency band B3 may be between the frequency band B1 and the frequency band B2, for example, the frequency band B1 may be a 2 GHz frequency band, the frequency band B2 may be a 5 GHz frequency band, and the frequency band B3 may be a 3.8 GHz frequency band.

When the transistor Tsr2 of the series switch circuit 14 is turned on and the RF signal Srf is operated in the frequency band B1, the sub-switch circuit 60 and the transistor T1 will be turned on, and the transistor T2 will be turned off to skip the compensation capacitor C1 and the compensation capacitor C2 and couple the second terminal of the sub-switch circuit 60 to the inductor L1 via the transistor T1, enabling the shunt switch circuit 12 and the inductor L1 to provide a first impedance. The first impedance corresponds to the isolation of the frequency band B1. When the transistor Tsr2 of the series switch circuit 14 is turned on and the RF signal Srf is operated in the frequency band B2, the sub-switch circuit 60 will be turned on, and the transistor T1 and the transistor T2 will be turned off to skip the compensation capacitor C2 and couple the second terminal of the sub-switch circuit 60 to the inductor L1 via the compensation capacitor C1, enabling the shunt switch circuit 12 and the inductor L1 to provide a second impedance. The second impedance corresponds to the isolation of the frequency band B2. When the transistor Tsr2 of the series switch circuit 14 is turned on and the RF signal Srf is operated in the frequency band B3, the sub-switch circuit 60 will be turned on, the transistor T1 will be turned off, and the transistor T2 will be turned on, to couple the second terminal of the sub-switch circuit 60 to the inductor L1 via the parallel-coupled compensation capacitor C1 and the compensation capacitor C2, thereby enabling the shunt switch circuit 12 and the inductor L1 to provide a third impedance. The third impedance corresponds to the isolation of the frequency band B3. The first impedance, the second impedance, and the third impedance may be equal. Therefore, in FIG. 7, a sum of the equivalent impedance of the shunt switch circuit 12 and the impedance ZL of the inductor L1 remains substantially constant in the frequency bands B1 to B3, and consequently, the signal isolation of the RF switch 1 remains unchanged in the frequency bands B1 to B3, while enhancing the ESD characteristics.

Figure 8:
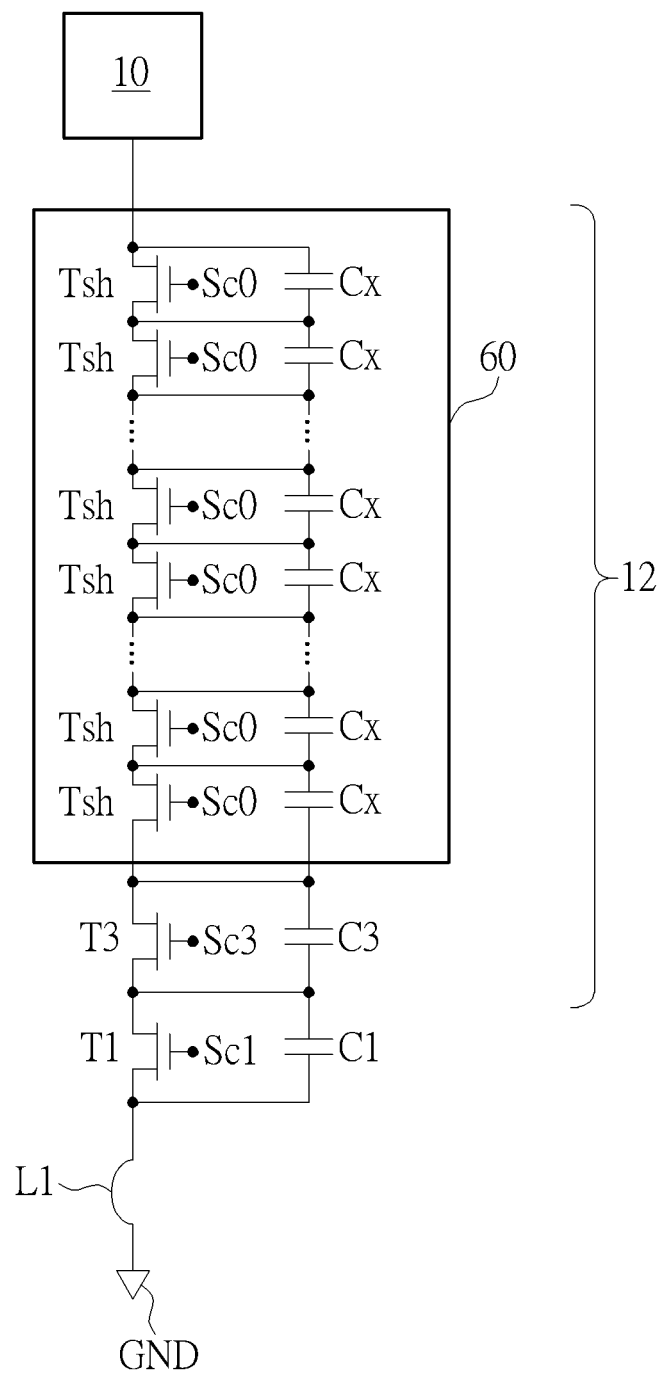
FIG. 8 is a circuit schematic of the shunt switch circuit in FIG. 1 according to another embodiment of the invention.

FIG. 8 is a circuit schematic of the shunt switch circuit 12 according to another embodiment of the invention. FIG. 8 and FIG. 6 are different in that the shunt switch circuit 12 in FIG. 8 further includes a transistor T3 and a compensation capacitor C3. The transistor T3 includes a first terminal coupled to the second terminal of the sub-switch circuit 60, a second terminal, and the control terminal configured to receive a control signal Sc3 to control the transistor T3. The transistor T3 may be an N-type MOSFET, and the control signal Sc3 may be a voltage signal. The compensation capacitor C3 is coupled in parallel to the transistor T3, and includes a first terminal coupled to the first terminal of the transistor T3, and a second terminal coupled to the second terminal of the transistor T3. The first terminal of the transistor T1 is coupled to the second terminal of the transistor T3, and the second terminal of the transistor T1 is coupled to the inductor L1.

The control signal Sc0, the control signal Sc1, and the control signal Sc3 may separately control the I transistors Tsh, the transistor T1, and the transistor T2, so that the shunt switch circuit 12 in FIG. 8 may provide different equivalent impedances in the frequency bands B1 to B4. as shown in Table 3:

TABLE 3

| Frequency band | Tsh | T1 | T3 | C1 | C3 |
| --- | --- | --- | --- | --- | --- |
| B1 | On | On | On | No | No |
| B2 | On | Off | Off | Yes | Yes |
| B3 | On | Off | On | Yes | No |
| B4 | On | On | Off | No | Yes |

The frequency bands B1 to B4 may be different. When the transistor Tsr2 of the series switch circuit 14 is turned on and the RF signal Srf is operated in the frequency band B1, the sub-switch circuit 60, the transistor T1, and the transistor T3 will be turned on to skip the compensation capacitor C1 and the compensation capacitor C3 and couple the second terminal of the sub-switch circuit 60 to the inductor L1 via the transistors T3 and T1, enabling the shunt switch circuit 12 and the inductor L1 to provide a first impedance. The first impedance corresponds to the isolation of the frequency band B1. When the transistor Tsr2 of the series switch circuit 14 is turned on and the RF signal Srf is operated in the frequency band B2, the sub-switch circuit 60 will be turned on, and the transistor T1 and the transistor T3 will be turned off to couple the second terminal of the sub-switch circuit 60 to the inductor L1 via the serial-compensation capacitor C1 and the compensation capacitor C3, enabling the shunt switch circuit 12 and the inductor L1 to provide a second impedance. The second impedance corresponds to the isolation of the frequency band B2. When the transistor Tsr2 of the series switch circuit 14 is turned on and the RF signal Srf is operated in the frequency band B3, the sub-switch circuit 60 and the transistor T3 will be turned on, and the transistor T1 will be turned off to skip the compensation capacitor C3 and couple the second terminal of the sub-switch circuit 60 to the inductor L1 via the transistor T3 and the compensation capacitor C1, enabling the shunt switch circuit 12 and the inductor L1 to provide a third impedance. The third impedance corresponds to the isolation of the frequency band B3. When the transistor Tsr2 of the series switch circuit 14 is turned on and the RF signal Srf is operated in the frequency band B3, the sub-switch circuit 60 and the transistor T1 will be turned on, and the transistor T3 will be turned off to skip the compensation capacitor C1 and couple the second terminal of the sub-switch circuit 60 to the inductor L1 via the compensation capacitor C3 and the transistor T1, enabling the shunt switch circuit 12 and the inductor L1 to provide a fourth impedance. The fourth impedance corresponds to the isolation of the frequency band B4. The first impedance, the second impedance, the third impedance, and the fourth impedance may be equal.

Therefore, in FIG. 8, a sum of the equivalent impedance of the shunt switch circuit 12 and the impedance ZL of the inductor L1 remains substantially constant in the frequency bands B1 to B4, and consequently, the signal isolation of the RF switch 1 remains unchanged in the frequency bands B1 to B4, while enhancing the ESD characteristics.

While the embodiments in FIGS. 1 to 2, and 4 to 8 are only applicable to the RF switch 1 operating in the 2 to 4 frequency bands, those skilled in the art may modify the shunt switch circuits 12 and 16 according to the principles of the present invention to enable the RF switch 1 to operate in more frequency bands.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A radio frequency (RF) switch comprising:
 a first signal terminal configured to receive an RF signal;
 a second signal terminal;
 a first series switch circuit coupled to the first signal terminal and the second signal terminal, and comprises a first series transistor;
 a shunt switch circuit coupled to the first series switch circuit, the shunt switch circuit comprising:
  a first sub-switch circuit;
  a first transistor coupled to the first sub-switch circuit; and
  a first compensation capacitor coupled in parallel to the first transistor;
 an inductor coupled to the shunt switch circuit; and
 a reference voltage terminal coupled to the inductor;
 wherein when the RF signal is operated in a first frequency band, the first transistor is turned on, and the shunt switch circuit and the inductor provide a first impedance; and when the RF signal is operated in a second frequency band, the first transistor is turned off, and the shunt switch circuit and the inductor provide a second impedance.

2. The RF switch of claim 1, wherein the first sub-switch circuit is coupled to the first series switch circuit.

3. The RF switch of claim 1, wherein the shunt switch path further comprises a second sub-switch circuit coupled to the first transistor, the first compensation capacitor and the inductor.

4. The RF switch of claim 1, wherein the first transistor and the first compensation capacitor are further coupled to the first series switch circuit.

5. The RF switch of claim 1, wherein the first sub-switch circuit comprises a plurality of stacked transistors.

6. The RF switch of claim 5, wherein the plurality of stacked transistors are equal in size.

7. The RF switch of claim 5, wherein the plurality of stacked transistors are controlled by a first control signal, and the first transistor is controlled by a second control signal.

8. The RF switch of claim 1, further comprising:
a third signal terminal; and
a second series switch circuit coupled to the first signal terminal and the third signal terminal, and comprising a second series transistor.

9. The RF switch of claim 8, wherein:
when the second series transistor is turned on and the RF signal is operated in the first frequency band, the first impedance corresponds to isolation of the first frequency band; and
when the second series transistor is turned on and the RF signal operates in the second frequency band, the second impedance corresponds to isolation of the second frequency band, the second frequency band being different from the first frequency band.

10. The RF switch of claim 1, wherein the second impedance is equal to a sum of an on-resistance of the first sub-switch circuit, an impedance of the first compensation capacitor and an impedance of the inductor.

11. The RF switch of claim 1, wherein a frequency of the first frequency band is lower than a frequency of the second frequency band.

12. The RF switch of claim 1, wherein the first frequency band is a 2 GHz frequency band, and the second frequency band is a 5 GHz frequency band.

13. The RF switch of claim 1, wherein the first impedance is equal to the second impedance.

14. The RF switch of claim 1, wherein the first sub-switch circuit comprises:
a plurality of stacked transistors; and
a plurality of coupling capacitors, each coupling capacitor being coupled to a first terminal and a second terminal of a corresponding one of the plurality of stacked transistors.

15. The RF switch of claim 14, wherein the plurality of stacked transistors are equal in size;
the plurality of coupling capacitors are equal in size; and
the plurality of stacked transistors are controlled by a first control signal, and the first transistor is controlled by a second control signal.

16. The RF switch of claim 14, further comprising:
a second transistor coupled to the first sub-switch circuit; and
a second compensation capacitor coupled to the second transistor in series.

17. The RF switch of claim 16, wherein:
when the second series transistor is turned on and the shunt switch circuit provides isolation corresponding to the first frequency band, the first sub-switch circuit and the first transistor are turned on, and the second transistor is turned off to enable the shunt switch circuit and the inductor to provide the first impedance; and
when the second series transistor is turned on and the shunt switch circuit provides isolation corresponding to the second frequency band, the first sub-switch circuit is turned on, the first transistor is turned off, and the second transistor is turned off to enable the shunt switch circuit and the inductor to provide the second impedance.

18. The RF switch of claim 17, wherein:
when the second series transistor is turned on and the shunt switch circuit provides isolation corresponding to a third frequency band, the first sub-switch circuit is turned on, the first transistor is turned off, and the second transistor is turned on to enable the shunt switch circuit and the inductor to provide a third impedance.

19. The RF switch of claim 17, wherein the first impedance, the second impedance, and the third impedance are equal, and the first frequency band, the second frequency band, and the third frequency band are different.

20. The RF switch of claim 1, wherein the inductor is a bond wire.

* * * * *